(12) United States Patent
Gross et al.

(10) Patent No.: US 7,269,536 B1
(45) Date of Patent: Sep. 11, 2007

(54) METHOD AND APPARATUS FOR QUANTITATIVELY DETERMINING SEVERITY OF DEGRADATION IN A SIGNAL

(75) Inventors: Kenny C. Gross, San Diego, CA (US); Keith A. Whisnant, La Jolla, CA (US); Gregory A. Cumberford, Calgary (CA)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 11/389,578

(22) Filed: Mar. 23, 2006

(51) Int. Cl.
*G06F 15/00* (2006.01)
(52) U.S. Cl. ......................................... 702/183; 714/25
(58) Field of Classification Search .................. 702/66, 702/67, 69, 182, 183, 184–185; 700/29, 700/30, 31; 714/25
See application file for complete search history.

(56) References Cited

U.S. PATENT DOCUMENTS

2006/0036403 A1* 2/2006 Wegerich et al. ........... 702/183

* cited by examiner

*Primary Examiner*—Edward Raymond
(74) *Attorney, Agent, or Firm*—Park, Vaughan & Fleming LLP

(57) ABSTRACT

One embodiment of the present invention provides a system that determines a severity of degradation in a signal. During operation, the system receives signal values for the signal, wherein the signal values are received with a constant sampling interval. Next, for each received signal value, the system applies a Sequential Probability Ratio Test (SPRT) to the signal value. If the SPRT generates an alarm on the signal value, the system increments a cumulative counter which records a running total number of the SPRT alarms. Upon receiving each signal value, the system updates a cumulative function using a value in the cumulative counter. Next, the system determines the severity of degradation in the signal from the shape of the cumulative function.

15 Claims, 5 Drawing Sheets

REAL-TIME TELEMETRY SYSTEM 100

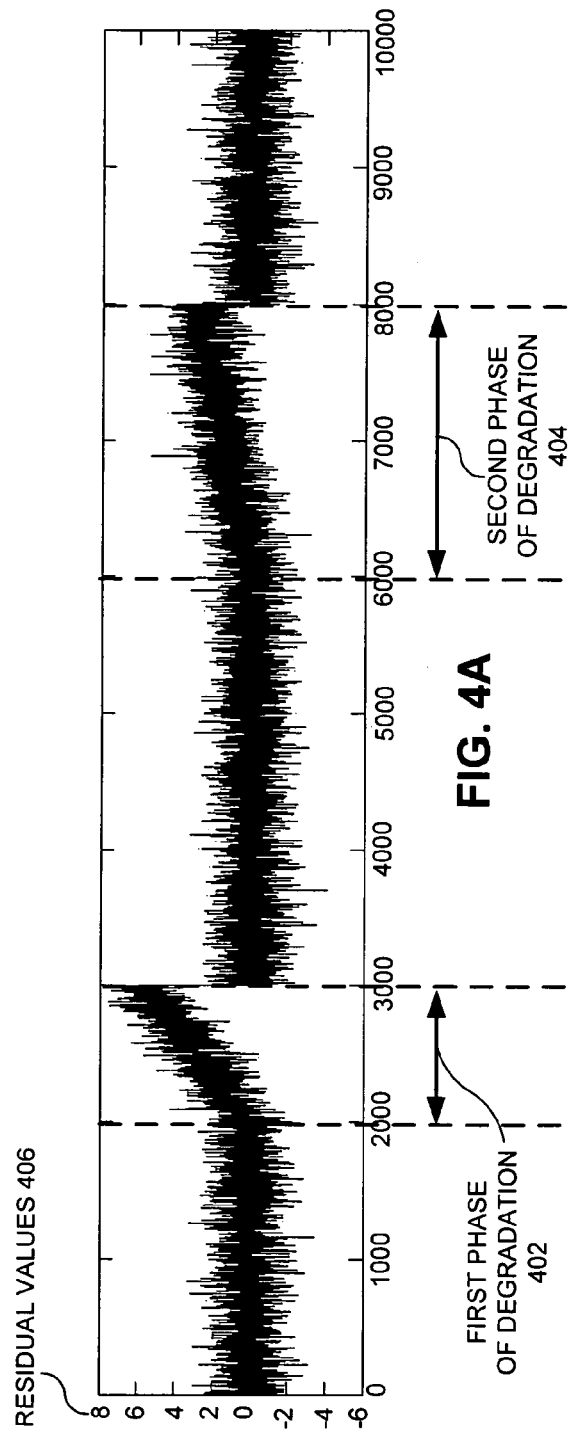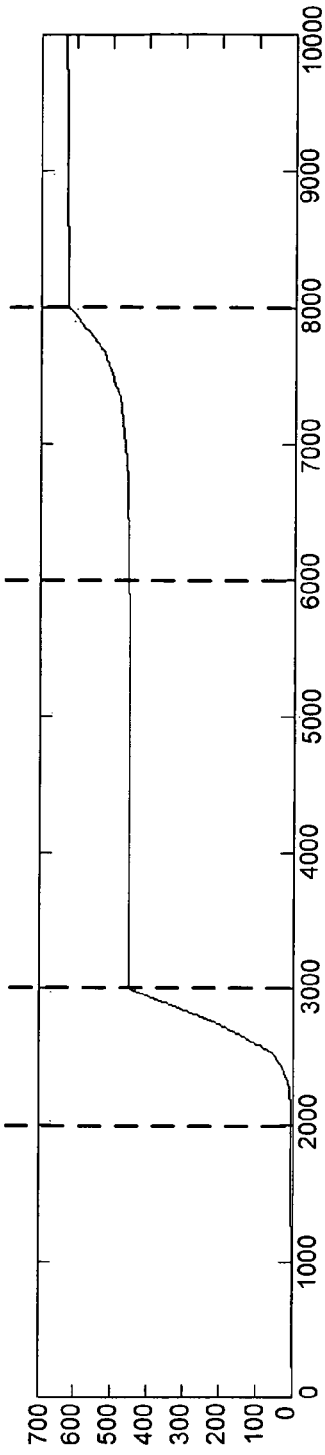

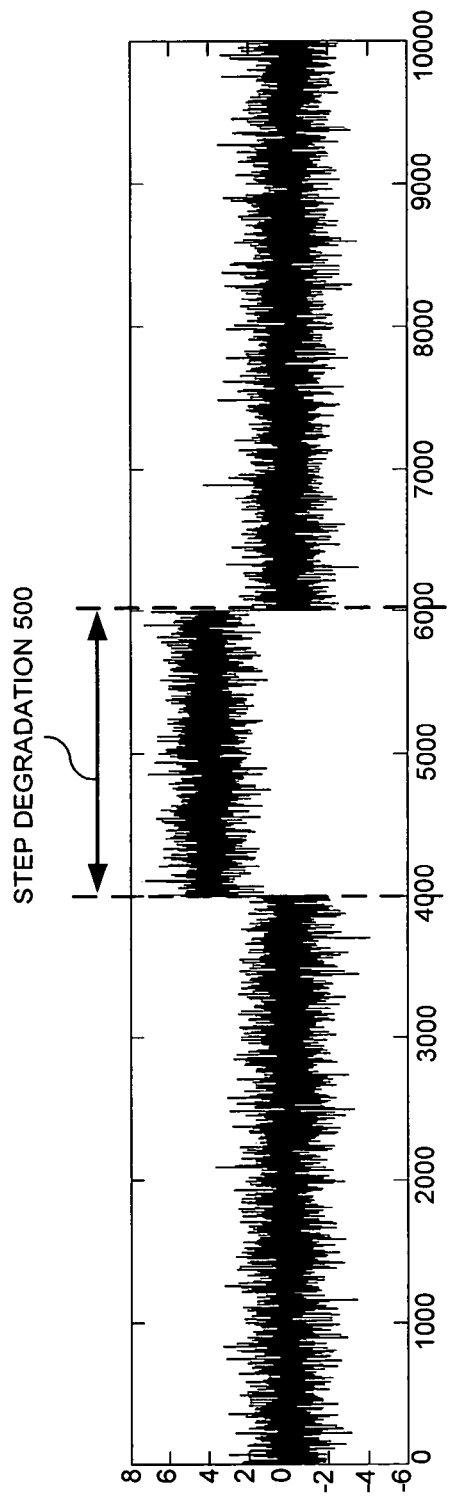
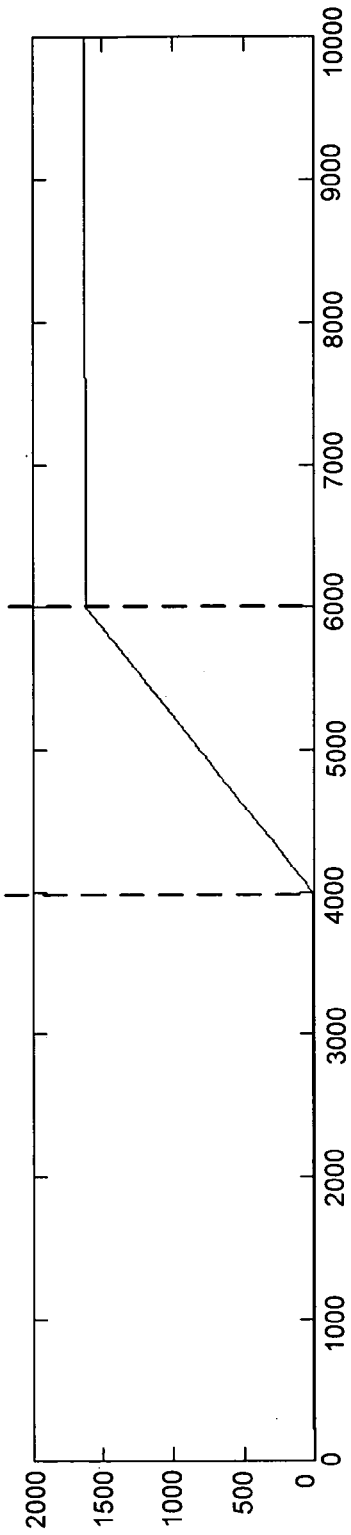

METHOD AND APPARATUS FOR QUANTITATIVELY DETERMINING SEVERITY OF DEGRADATION IN A SIGNAL

BACKGROUND

1. Field of the Invention

The present invention relates to techniques for proactively detecting impending problems in computer systems. More specifically, the present invention relates to a method and an apparatus for quantitatively determining the severity of degradation in a signal in a computer system.

2. Related Art

Modern computer server systems are typically equipped with a significant number of sensors which monitor signals during the operation of the computer systems. Results from this monitoring process can be used to generate time series data for these signals which can subsequently be analyzed to determine how well a computer system is operating. One particularly useful application of this analysis process is for "proactive fault-monitoring," to identify leading indicators of component or system failures before the failures actually occur.

Unfortunately, all existing proactive fault-monitoring systems have a serious limitation: they can only indicate that there are anomalies in the monitored signals, but provide no information on the degree or the severity of the degradation. For example, existing proactive fault-monitoring systems can either flag a component of a system to be at risk or not at risk, but cannot determine the level of the risk.

However, it is of tremendous interest to service engineers to have the knowledge of the degree or severity of degradation in the monitored systems. A quantitative indicator of the amount of degradation allows the service engineer to make appropriate decisions based on the actual health of the system with high confidence. For example, if a system is scheduled for shutdown due to a preventative maintenance on Saturday night and a warning flag is generated on Friday afternoon, it would be extremely beneficial for the service engineer to know if the detected degradation is of extremely low severity, so that the system can be allowed to operate safely until the scheduled outage time. On the other hand, if there is no scheduled shutdown in the near future and a warning flag is generated, the service engineer may desire to shutdown the system immediately if he/she knows that severity of the detected degradation is extremely high.

Hence, what is needed is a method and an apparatus for quantitatively determining the severity of degradation in a signal when the degradation is detected.

SUMMARY

One embodiment of the present invention provides a system that determines a severity of degradation in a signal. During operation, the system receives signal values for the signal, wherein the signal values are received with a constant sampling interval. Next, for each received signal value, the system applies a Sequential Probability Ratio Test (SPRT) to the signal value. If the SPRT generates an alarm on the signal value, the system increments a cumulative counter which records a running total number of the SPRT alarms. Upon receiving each signal value, the system updates a cumulative function using a value in the cumulative counter. Next, the system determines the severity of degradation in the signal from the shape of the cumulative function.

In a variation on this embodiment, the system determines the severity of degradation in the signal from the shape of the cumulative function by computing the slope of the cumulative function.

In a further variation on this embodiment, the slope of the cumulative function indicates the degree of severity of degradation in the signal.

In a further variation on this embodiment, an increase in the slope of the cumulative function indicates an increasing severity of degradation in the signal.

In a further variation on this embodiment, the system computes the slope of the cumulative function by: (1) selecting a predetermined number of successive data values in the cumulative function; and (2) computing the slope using the predetermined number of successive data values.

In a further variation on this embodiment, if the signal is degrading, the slope of the cumulative function: (1) increases continuously with time or observations; or (2) increases abruptly from a smaller value to a larger value and remains at the larger value.

In a variation on this embodiment, if the signal is not degrading, the cumulative function changes linearly with received signal values.

In a variation on this embodiment, if the SPRT does not generate an alarm on the signal value, the cumulative function value does not change.

BRIEF DESCRIPTION OF THE FIGURES

FIG. 4A illustrates two phases of degradation in a signal with different degrees of severity in accordance with an embodiment of the present invention.

FIG. 4B illustrates the corresponding MCF curve of the signal in FIG. 4A in accordance with an embodiment of the present invention.

FIG. 5A illustrates a step function degradation in a signal in accordance with an embodiment of the present invention.

FIG. 5B illustrates the corresponding MCF curve of the signal in FIG. 5A in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs).

Real-Time Telemetry System

Figure 1:
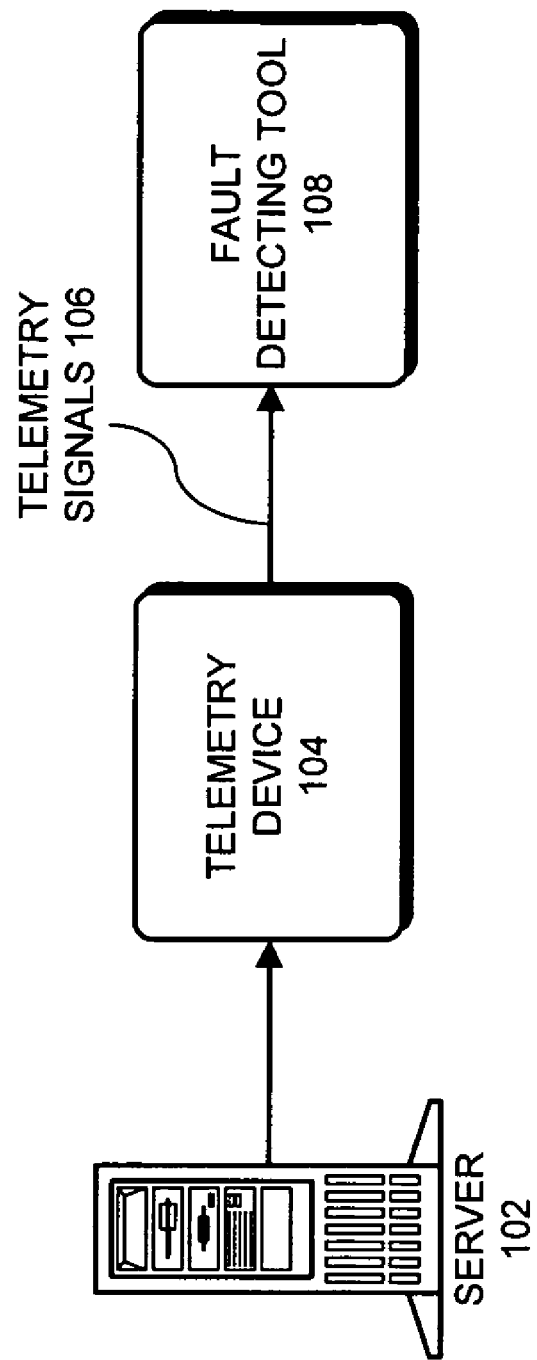
FIG. 1 illustrates real-time telemetry system in accordance with an embodiment of the present invention.

FIG. 1 illustrates real-time telemetry system 100 in accordance with an embodiment of the present invention. Real-time telemetry system 100 contains server 102. Server 102 can generally include any computational node including a mechanism for servicing requests from a client for computational and/or data storage resources. In the present embodiment, server 102 is a uniprocessor or multiprocessor server that is being monitored by real-time telemetry system 100.

Note that the present invention is not limited to the computer server system illustrated in FIG. 1. In general, the present invention can be applied to any type of computer system. This includes, but is not limited to, a computer system based on a microprocessor, a mainframe computer, a digital signal processor, a portable computing device, a personal organizer, a device controller, and a computational engine within an appliance.

Real-time telemetry system 100 also contains telemetry device 104, which gathers telemetry signals 106 from the various sensors and monitoring tools within server 102, and directs telemetry signals 106 to a local or a remote location that contains fault-detecting tool 108.

Note that telemetry signals 106 gathered by real-time telemetry system 104 can include signals associated with physical and/or software performance parameters measured through sensors within the computer system. The physical parameters can include, but are not limited to: distributed temperatures within the computer system, relative humidity, cumulative or differential vibrations within the computer system, fan speed, acoustic signals, currents, voltages, time-domain reflectometry (TDR) readings, and miscellaneous environmental variables. The software parameters can include, but are not limited to: load metrics, CPU utilization, idle time, memory utilization, disk activity, transaction latencies, and other performance metrics reported by the operating system.

Fault-detecting tool 108 monitors and analyzes telemetry signals 106 in real-time. Specifically, fault-detecting tool 108 detects anomalies in telemetry signals 106 and predicts probabilities of faults and failures in server 102. In one embodiment of the present invention, fault-detecting tool 108 is a Continuous System Telemetry Harness (CSTH). In one embodiment of the present invention, the CSTH performs Sequential Probability Ratio Test (SPRT) on telemetry signals 106. Note that the SPRT provides a technique for monitoring noisy process variables and detecting the incipience or onset of anomalies in such processes with high sensitivity. In one embodiment of the present invention, telemetry device 104 and fault-detecting tool 108 are both embedded in server 102 which is being monitored.

SPRT and False Alarm Probability (FAP)

One embodiment of the present invention uses a SPRT to analyze monitored telemetry signals from a system. The SPRT is a binary hypothesis test that analyzes process observations sequentially to determine whether or not the signal is consistent with normal behavior. When the SPRT reaches a decision about current process behavior (i.e., the signal is behaving normally or abnormally), it reports the decision and continues to process observations. In particular, the SPRT generates warning flags/alarms when anomalies are detected in the monitored signals.

Note that the SPRT can generate alarms even when the monitored signals contain no degradation. In such a case, the frequency of SPRT alarms is typically very low and less than a pre-assigned "false alarm probability" (FAP). The FAP specifies the probability of making a failure hypothesis when in fact a non-failure hypothesis holds. Note that the FAP cannot be zero, for mathematical reasons.

False alarms do not present any problem as long as the associated frequency of the false alarm is smaller than the FAP which is specified when initializing the SPRT. However, when the frequency of SPRT alarms exceeds the FAP, a problem is signaled for the monitored component, system, or process. For example, when FAP is set to be 0.01, it means that about 1 out of 100 observations, on average, will produce a false alarm. When the frequency of the occurrences of SPRT alarms is more than 0.01, this indicates that there is a problem in the monitored component, system, or process.

Inter-Arrival Time (IAT)

Figure 2A:
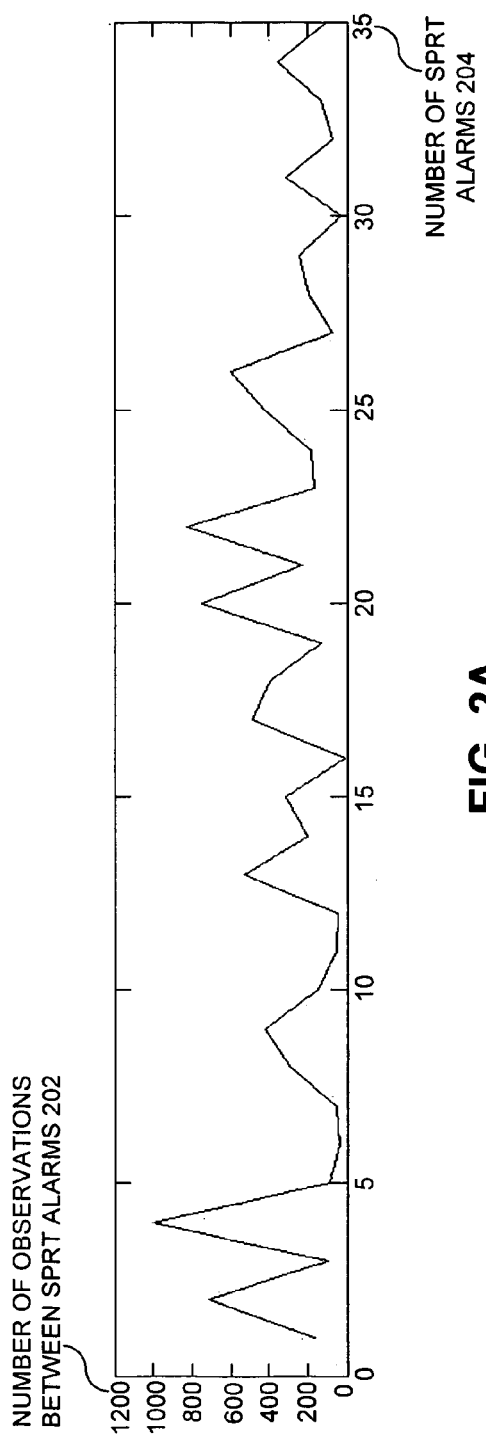
FIG. 2A illustrates an exemplary plot of an Inter-Arrival Time (IAT) as a function of a cumulative number of SPRT alarms for a monitored signal with no degradation in accordance with an embodiment of the present invention.

The time between successive SPRT alarms is referred to as the inter-arrival time (IAT). The IAT is an exponentially-distributed random variable when there is no degradation in the monitored signal. Note that the IAT can be measured in different time scales (e.g., second, minute, hour, etc.), depending upon the sampling rate of the monitored signal. Moreover, IAT measurement is not limited to time. Other measurements of the distance between successive SPRT alarms can be in terms of: number of cycles, number of incidents, or number of observations. FIG. 2A illustrates an exemplary plot of an IAT as a function of a cumulative number of SPRT alarms for a monitored signal with no degradation in accordance with an embodiment of the present invention. The y-value of each point in FIG. 2A represents the number of observations between successive SPRT alarms (202), which follows a random process. The horizontal axis of FIG. 2A represents the cumulative number of SPRT alarms (204).

Mean Cumulative Function (MCF)

We introduce "Mean Cumulative Function" (MCF), which represents a cumulative number of SPRT alarms as a function of time, or number of observations. To compute a MCF, one only needs to keep track of a running total number of the SPRT alarms for each new observation or sampling time. If a SPRT alarm is generated for a newly received sample value, the MCF is incremented by one. Otherwise, the MCF maintains its previous value for this sample value.

Figure 2B:
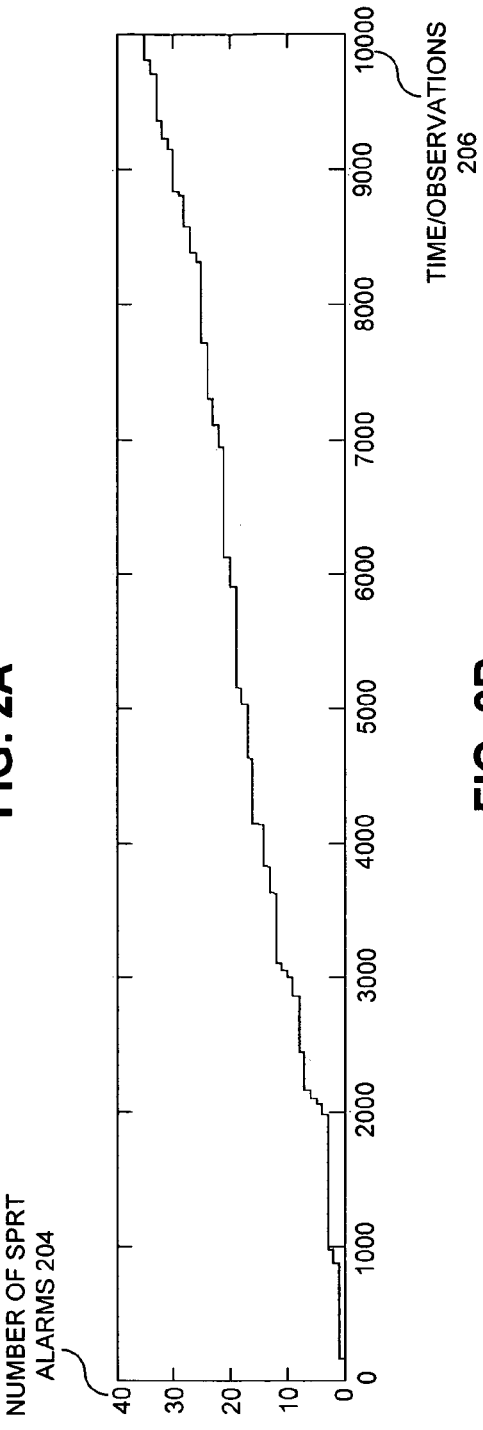
FIG. 2B illustrates the associated mean cumulative function (MCF) for the signal represented in FIG. 2A in accordance with an embodiment of the present invention.

FIG. 2B illustrates the associated MCF for the SPRT alarms represented in FIG. 2A in accordance with an embodiment of the present invention. The vertical axis represents the cumulative number of SPRT alarms (204) and the horizontal axis represents time or sequence of observations (206). Note that for the signal in FIG. 2A (which has no apparent degradation), the associated IAT follows a random process, while the associated MCF versus time/observation plot changes linearly with time/observation (see also "Applied Reliability," 2nd Edition, Chapter 10, Tobias, P. A., and Trindade, D. C., New York: Van Nostrand Reinhold, 1995). Consequently, the slope of the MCF curve for a signal with no degradation is nearly a constant.

On the other hand, if degradation suddenly appears in a monitored signal, the frequency of the SPRT alarms starts increasing dramatically, which subsequently causes the MCF value to also increase rapidly. As a result, the slope of the MCF curve, which measures the rate of the MCF change with time/observation, increases as well. Hence, the slope of a MCF curve can provide a quantitative measure of the frequency of SPRT alarms, which can be used as an indicator of the degree of severity of degradation in the original monitored signal.

Determine the Severity of Degradation in a Signal

Figure 3:
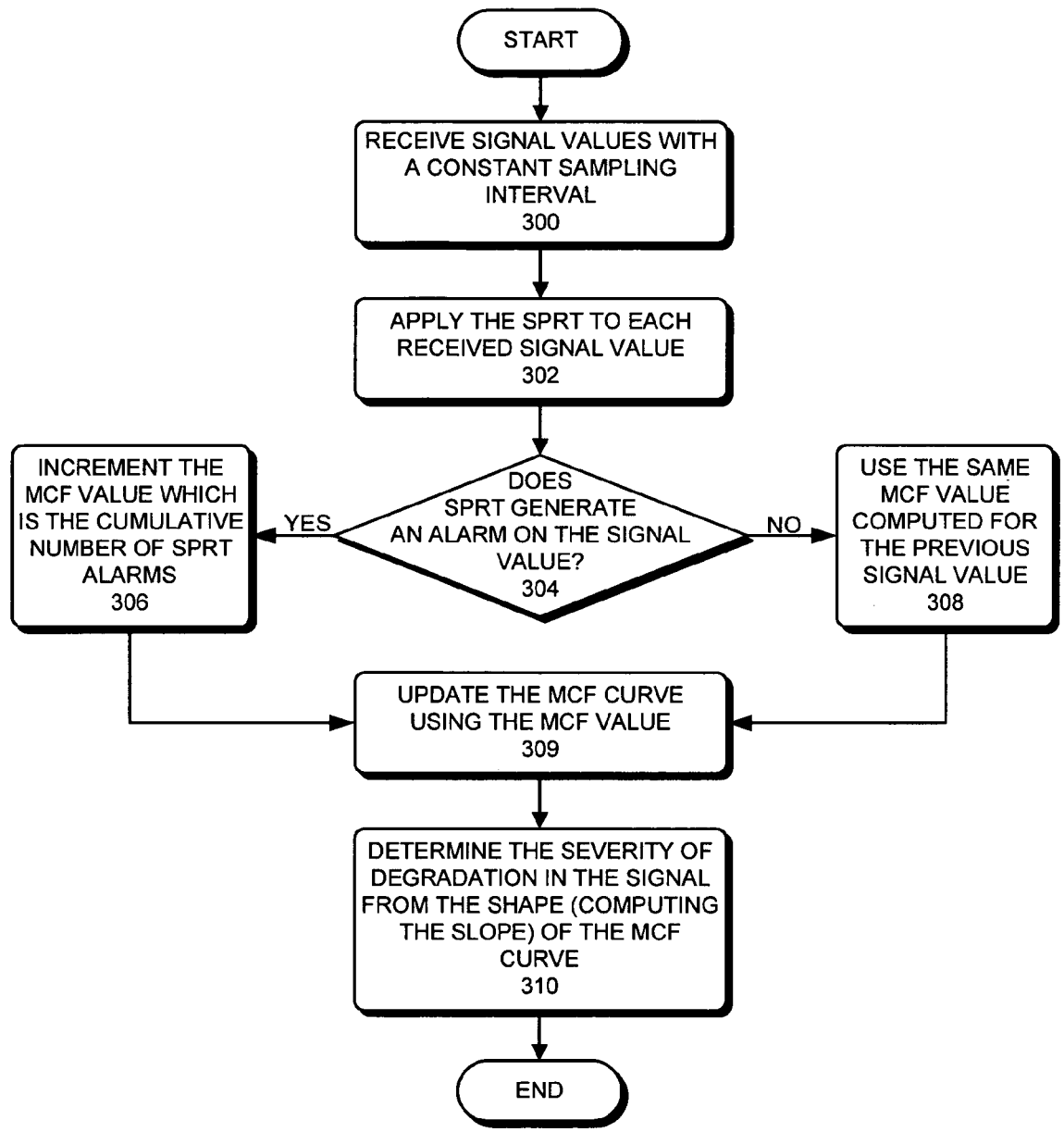
FIG. 3 presents a flowchart illustrating the process of determining the severity of degradation in a signal in accordance with an embodiment of the present invention.

FIG. 3 presents a flowchart illustrating the process of determining the severity of degradation in a signal in accordance with an embodiment of the present invention.

The process starts by receiving a signal, wherein the signal values are received with a constant sampling interval (step 300).

Next, for each received signal value, the process applies the SPRT to the signal value (step 302).

The system next determines if the SPRT generates an alarm on the signal value (step 304). If so, the system increments an associated MCF value which keeps track of a running total number of the SPRT alarms (step 306). If the SPRT does not generate an alarm on the signal value, the MCF value for the current signal value assumes the previous MCF value computed for the previous signal value (step 308). The system then updates a MCF curve for the received signal value using the MCF value (step 309).

Next, the system determines the severity of degradation in the signal from the shape of the MCF curve (step 310). In one embodiment of the present invention, the system determines the severity of degradation from the shape of the MCF curve by computing the slope of the MCF curve, wherein an increase in the slope of the MCF curve indicates an increasing severity of degradation in the signal.

Note that because the IAT in time/observations between successive SPRT alarms can be noisy, the associated MCF curve can also appear "choppy" in response. In order to reduce the effect of noisiness in the MCF curve, one embodiment of the present invention computes the slope of the MCF curve using a predetermined window size, which contains a predetermined number of successive data values. This computation can be performed using a linear interpolation or a linear regression using these data values. Note that the number of successive data values used to compute the slope should be carefully chosen. When a larger number is used, the computation can reduce the effect of noisiness in the MCF curve but can lose some responsiveness. On the other hand, when a smaller number is used, the computation result is more instantaneous but will lose some smoothness. It is therefore desirable to constantly adjust the number of data values used to compute the slope based on the frequency of the SPRT alarms, wherein the number can be gradually reduced as the frequency increases.

Note that the degradation in a signal can show up in different forms which would result in different behaviors in the MCF curve and the associated slope of the MCF curve. However, different forms of degradation will cause the MCF curve to show two types of slope behavior: (1) the slope increases continuously with time/observations; or (2) the slope increases abruptly from a smaller value to a larger value and remains at the larger value.

FIG. 4A illustrates two phases of degradation in a signal with different degrees of severity in accordance with an embodiment of the present invention. Note that the first phase of the degradation 402 occurs around 2000 to 3000 observations with a higher degree of severity (a more rapid drift upward), whereas the second phase of the degradation 404 occurs around 6000 to 8000 observations with a lower degree of severity (a less rapid drift upward).

FIG. 4B illustrates the corresponding MCF curve of the signal in FIG. 4A in accordance with an embodiment of the present invention. Note that in FIG. 4B there is a concurrent first phase of slope increase around 2000 to 3000 observations. Before 2000 observations, the MCF curve demonstrates a normal linear behavior, and after 3000 observations, the signal returns to normal, and hence of the slope of the corresponding MCF curve returns to the same small constant value as before 2000 observations. During the second phase of the degradation, the slope of the MCF curve in FIG. 4B again increases continuously, indicating the degradation is reoccurring. However, the slopes between 6000 and 8000 observations increase at a slower rate than the rate between 2000 and 3000 observations. Note that the slope can be used as a quantitative metric for the degree of severity of the degradation.

FIG. 5A illustrates a step function degradation in a signal in accordance with an embodiment of the present invention. Instead of a gradual but increasing degradation as shown in FIG. 4A, the step function degradation 500 jumps up to a risky level abruptly and remains at the risky level. FIG. 5B illustrates the corresponding MCF curve of the signal in FIG. 5A in accordance with an embodiment of the present invention. As seen in FIG. 5B, the slope increases abruptly from a smaller value to a significantly larger value at around 4000 observations, which is when the step function degradation 500 in the signal kicks in. The slope then remains at the larger value until the end of degradation 500 at around 6000 observations, and drops back down to the same smaller value for the signal before degradation 500. Once again, the slope of the MCF curve provides a quantitative metric associated with the degree of degradation or "risk" for the monitored system.

Note that generally when a fault-detection system attempts to establish certain criteria for detecting degradation based on original telemetry signals, the system is subject to the dependency on the magnitude, noisiness, or units of the original telemetry signals. The advantage of integrating an MCF approach with a SPRT alarm frequency is that the slope of the MCF curve removes any dependency on the magnitude, noisiness, or units for the original signal under surveillance, and provides a dimensionless, quantitative metric for the degree of severity in the original signal. Furthermore, the slope of the MCF curve can be computed and analyzed automatically, thereby freeing humans from the tedious task of monitoring the telemetry signals for the appearance of degradation.

Note that we have assumed that a departure from stationarity in a signal is an indication of the degradation, which is the case for many monitored telemetry signals in computing systems. Moreover, we have assumed that the farther the signal deviates from its nominal value and the faster it departs from its nominal value, the more severe the degradation is.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a severity of degradation in a signal, comprising:
   receiving signal values for the signal, wherein the signal values are received with a constant sampling interval;
   for each received signal value,
      applying a Sequential Probability Ratio Test (SPRT) to the signal value;
      if the SPRT generates an alarm on the signal value, incrementing a cumulative counter which records a running total number of the SPRT alarms for the signal; and
      updating a cumulative function for the received signal value using a value in the cumulative counter;
   computing the slope of the cumulative function; and
   determining the severity of degradation in the signal from the computed slope of the cumulative function,
   wherein the slope of the cumulative function indicates the degree of severity of degradation in the signal.

2. The method of claim 1, wherein an increase in the slope of the cumulative function indicates an increasing severity of degradation in the signal.

3. The method of claim 1, wherein computing the slope of the cumulative function involves:
   selecting a predetermined number of successive data values in the cumulative function; and
   computing the slope using the predetermined number of successive data values.

4. The method of claim 1, wherein if the signal is degrading, the slope of the cumulative function:
   increases continuously with time or observations; or
   increases abruptly from a smaller value to a larger value and remains at the larger value.

5. The method of claim 1, wherein if the signal is not degrading, the cumulative function changes linearly with received signal values.

6. The method of claim 1, wherein if the SPRT does not generate an alarm on the signal value, the cumulative function value does not change.

7. A computer-readable storage medium storing instructions that when executed by a computer cause the computer to perform a method for determining a severity of degradation in a signal, comprising:
   receiving signal values for the signal, wherein the signal values are received with a constant sampling interval;
   for each received signal value,
      applying a Sequential Probability Ratio Test (SPRT) to the signal value;
      if the SPRT generates an alarm on the signal value, incrementing a cumulative counter which records a running total number of the SPRT alarms for the signal; and
      updating a cumulative function for the received signal value using a value in the cumulative counter;
   computing the slope of the cumulative function; and
   determining the severity of degradation in the signal from the computed slope of the cumulative function,
   wherein the slope of the cumulative function indicates the degree of severity of degradation in the signal.

8. The computer-readable storage medium of claim 7, wherein an increase in the slope of the cumulative function indicates an increasing severity of degradation in the signal.

9. The computer-readable storage medium of claim 7, wherein computing the slope of the cumulative function involves:
   selecting a predetermined number of successive data values in the cumulative function; and
   computing the slope using the predetermined number of successive data values.

10. The computer-readable storage medium of claim 7, wherein if the signal is degrading, the slope of the cumulative function:
    increases continuously with time or observations; or
    increases abruptly from a smaller value to a larger value and remains at the larger value.

11. The computer-readable storage medium of claim 7, wherein if the signal is not degrading, the cumulative function changes linearly with received signal values.

12. The computer-readable storage medium of claim 7, wherein if the SPRT does not generate an alarm on the signal value, the cumulative function value does not change.

13. An apparatus that determines a severity of degradation in a signal, comprising:
    a receiving mechanism configured to receive signal values for the signal, wherein the signal values are received with a constant sampling interval;
    a SPRT mechanism configured to applying a Sequential Probability Ratio Test (SPRT) to each received signal value;
    wherein if the SPRT generates an alarm on the received signal value, the SPRT mechanism is configured to increment a cumulative counter which records a running total number of the SPRT alarms;
    an updating mechanism configured to update a cumulative function for the received signal value using a value in the cumulative counter;
    a computing mechanism configured to compute the slope of the cumulative function; and
    a determination mechanism configured to determine the severity of degradation in the signal from the computed slope of the cumulative function,
    wherein the slope of the cumulative function indicates the degree of severity of degradation in the signal.

14. The apparatus of claim 13, wherein an increase in the slope of the cumulative function indicates an increasing severity of degradation in the signal.

15. The apparatus of claim 13, wherein while computing the slope of the cumulative function, the determination mechanism is configured to:
    select a predetermined number of successive data values in the cumulative function; and to
    compute the slope using the predetermined number of successive data values.

* * * * *